United States Patent
Tankielun et al.

(10) Patent No.: US 10,777,900 B2
(45) Date of Patent: Sep. 15, 2020

(54) ANTENNA UNIT, RADIO FREQUENCY CIRCUIT AND METHOD FOR MANUFACTURING AN ANTENNA UNIT

(71) Applicant: Rohde & Schwarz GmbH & Co. KG, Munich (DE)

(72) Inventors: Adam Tankielun, Ottobrunn (DE); Arslan Azhar, Munich (DE); Stefan Zorn, Deggendorf (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 43 days.

(21) Appl. No.: 15/600,628

(22) Filed: May 19, 2017

(65) Prior Publication Data
US 2018/0115077 A1   Apr. 26, 2018

Related U.S. Application Data

(63) Continuation-in-part of application No. 15/332,779, filed on Oct. 24, 2016, now Pat. No. 10,665,933.

(51) Int. Cl.
*H01Q 13/08* (2006.01)
*H05K 1/02* (2006.01)
*H01Q 1/38* (2006.01)

(52) U.S. Cl.
CPC .......... *H01Q 13/085* (2013.01); *H05K 1/024* (2013.01); *H01Q 1/38* (2013.01); *H05K 2201/0191* (2013.01); *H05K 2201/10098* (2013.01)

(58) Field of Classification Search
CPC .......... H01Q 13/106; H01Q 13/10–18; H05K 1/024; H05K 2201/0191
See application file for complete search history.

(56) References Cited

U.S. PATENT DOCUMENTS

| 7,009,572 | B1 * | 3/2006 | Homer | H01Q 13/085 343/767 |
| 8,504,135 | B2 * | 8/2013 | Bourqui | H01Q 13/085 343/785 |
| 9,142,889 | B2 | 9/2015 | Pazin et al. | |
| 9,606,158 | B2 * | 3/2017 | Tankielun | G01R 29/105 |

OTHER PUBLICATIONS

Final Office Action from U.S. Appl. No. 15/332,779 dated Jan. 2, 2019, 9 pgs.
Non-Final Office Action from U.S. Appl. No. 15/332,779 dated Oct. 21, 2019, 16 pgs.

* cited by examiner

*Primary Examiner* — Graham P Smith
*Assistant Examiner* — Amal Patel
(74) *Attorney, Agent, or Firm* — Schwabe, Williamson & Wyatt, P.C.

(57) ABSTRACT

An antenna unit for receiving and/or emitting electromagnetic waves having a certain wavelength is described. Said antenna unit is a slotline antenna unit having a slot region. Said antenna unit comprises at least one antenna element and a first carrier. Said first carrier is made by a dielectric material wherein said first carrier has at least one cutout in said slot region. Said antenna element is made by a printed circuit board. Said antenna element and said first carrier are attached to each other wherein said first carrier has a thickness being less than one fifth of said wavelength. Further, a radio frequency circuit and a method for manufacturing an antenna unit are described.

18 Claims, 3 Drawing Sheets

ANTENNA UNIT, RADIO FREQUENCY CIRCUIT AND METHOD FOR MANUFACTURING AN ANTENNA UNIT

CROSS REFERENCE TO RELATED APPLICATIONS

This application is a continuation-in-part of pending U.S. application Ser. No. 15/332,779, filed Oct. 24, 2016, the disclosure of which is herein incorporated by reference.

TECHNICAL FIELD

The invention relates to an antenna unit for receiving and/or emitting electromagnetic waves having a certain wavelength and a method for manufacturing an antenna unit.

BACKGROUND OF THE INVENTION

In the state of the art, tapered slotline antennas (TSAs) are known which are used for determining and/or measuring radiation and signal characteristics of wireless devices over the air (OTA measurements). The tapered slotline antennas are also called Vivaldi antennas. For instance, such tapered slotline antennas can be used for testing devices under test (DUTs) such as communication devices in certain frequency ranges. The tapered slotline antennas may be formed by a printed circuit board having a low thickness.

However, the small thickness of such tapered slotline antennas results in a low mechanical stability. Thus, the risk is high that the tapered slotline antenna gets damaged while using the tapered slotline antenna.

Further, it is known to use a bulky dielectric holder which supports the tapered slotline antenna such that the mechanical stability is improved. However, the bulky dielectric holder influences the radiation performance of the tapered slotline antenna. For instance, reflections occur resulting in side lobes in the radiation pattern which are not desired. These side lobes negatively affect the radiation performance of the slotline antenna.

Besides the tapered slotline antennas standard, gain horn (SGH) antennas may be used which have a higher mechanical robustness.

Accordingly, the antenna units known in the prior art do not have satisfying characteristics regarding their mechanical robustness and radiation performance. Thus, there is a need for an antenna unit having both good radiation performance and mechanical robustness.

SUMMARY OF THE INVENTION

The invention provides an antenna unit for receiving and/or emitting electromagnetic waves having a certain wavelength, said antenna unit being a tapered slotline antenna unit having a slot region, said antenna unit comprising at least one antenna element and a first carrier, said first carrier being made by a dielectric material wherein said first carrier has at least one cutout in said slot region, said antenna element being made by a printed circuit board, said antenna element and said first carrier being attached to each other wherein said first carrier has a thickness being less than one fifth of said wavelength.

The invention is based on the finding that the antenna unit has better mechanical characteristics like robustness and stiffness since the antenna element is supported by the first carrier. In addition, the first carrier has a shape which does not negatively affect the electromagnetic performance of the antenna unit, in particular the radiation and signal characteristics. Since the thickness of the first carrier is less than one fifth of said wavelength $$\left(<\frac{\lambda}{2}\right),$$

the whole antenna unit is compact even though the mechanical robustness of the antenna unit is improved. Furthermore, the antenna unit has a more directive radiation pattern wherein the side lobes are reduced with respect to mechanically robust tapered slotline antennas known in the prior art. Accordingly, the radio frequency performance of the antenna unit is improved. The slotline region is inter alia defined by two conductive portions being arranged axially symmetrical to each other with respect to the main direction. Between both conductive portions, a slot is provided that widens to the end of antenna unit being the aperture. The tapered slotline antenna is configured to emit electromagnetic waves in the microwave range. Generally, the antenna unit is configured to be used for measuring inter alia 802.11ad and 5G devices under test (DUTs) in a frequency range being lager than 18 GHz.

Moreover, the antenna unit is configured to be used as a part of a power sensor measuring the power of a device under test over the air.

According to an aspect, said first carrier has at least two first carrier portions being partially separated by said cutout. The cutout is located in a region of the antenna unit where the power density of the electromagnetic signals radiated by the antenna unit is high. This ensures that the first carrier does not impair the radio frequency performance of the antenna unit, in particular the radiation and signal characteristics.

Further, said first carrier may have at least one bridge portion interconnecting both first carrier portions. Thus, the first carrier is made in one piece ensuring that the whole antenna unit is attached to one single first carrier. In other words, the slot formed within the first carrier does not extend over the whole length of the first carrier.

According to one embodiment, said bridge portion is located at that end of said slot region being wider. Accordingly, the bridge portion is located next to the aperture of the antenna unit wherein the aperture is provided at the end of the slot region being wider. In other words, a person facing the antenna unit, in particular the aperture of the antenna unit, looks at the bridge portion directly. Hence, the cutout is not visible. Thus, the bridge portion covers the cutout.

According to another embodiment, said bridge portion is located at that end of said slot region being narrower. This means that the bridge portion does not cover the cutout when looking at the aperture of the antenna unit.

Particularly, said bridge portion maybe smaller in radiation direction than said wavelength. This ensures that the first carrier, in particular the bridge portion, does not negatively affect the radio frequency performance of the antenna unit.

According to another aspect, said first carrier is formed by a material having a relative electrical permittivity being less than 10. This electrical permittivity of the material used for the first carrier ensures that the electromagnetic interaction between the first carrier and the radiation pattern emitted by the antenna unit is minimized.

Generally, the first carrier is made of a material having a different electrical permittivity than the antenna element.

According to a certain embodiment, said antenna element and said first carrier both are formed by a printed circuit board panel. Thus, the antenna unit is structured by layers defined by the printed circuit board panels. Therefore, the antenna unit maybe a multilayer printed circuit board device.

Generally, the first carrier may be made by a printed circuit board or any other dielectric element being formed like a plate. The dielectric material ensures that the electromagnetic influence of the first carrier is minimized.

Furthermore, said first carrier may be configured such that it provides mechanical stiffness without impairing the radio frequency characteristics of said antenna unit. As already mentioned, the first carrier has a positive influence on the mechanical properties of the antenna unit, in particular improving the mechanical stiffness and/or robustness of the antenna unit due to the additional material. In addition, the first carrier is made by a certain dielectric material ensuring that the radio frequency performance of the antenna unit is not negatively affected by the first carrier. Furthermore, the first carrier has a shape which reduces the reflections of the electromagnetic waves emitted which in turn improves the radio frequency performance of the antenna unit, in particular the directivity.

According to an aspect, said first carrier and said antenna element are chemically or mechanically attached to each other. Thus, the first carrier and the antenna element can be connected with each other in different ways wherein the type of connection may depend on the field of application intended.

Particularly, said first carrier and said antenna element are attached to each other by adhering, riveting, screwing, soldering, brazing, clamping and/or form fit. These types of connections ensure that the first carrier and the antenna element can be attached to each other easily and in a cost-efficient way. Depending on the field of application, a certain type of connection might be preferred.

According to an embodiment, a second carrier is provided, said second carrier having a different shape with regard to said first carrier. The second carrier provides more stiffness to the whole antenna unit while not impairing the radio frequency properties of the antenna unit. Moreover, the different shape of said second carrier has a positive influence on the radio frequency properties of the whole antenna unit.

Particularly, said second carrier is located in a connecting area of said antenna unit. The connecting area may comprise screw holes or the like for connecting the antenna unit to a radio frequency device that processes the signals received or transmitted appropriately. The second carrier increases the stiffness of the antenna unit in that area being exposed to forces.

According to an aspect, said second carrier has two second carrier portions being separated from each other. These portions both may be located at opposite edges of the first carrier wherein both portions extend towards each other from the edges. Thus, a substantially symmetrical arrangement is provided by splitting the second carrier in two portions, in particular two substantially symmetrically shaped second carrier portions.

Said second carrier may have a thickness being substantially twice the thickness of said first carrier. Accordingly, the second carrier gives more stiffness to the whole antenna unit even though it does not impair the weight since the second carrier only covers the first carrier partly. The different thicknesses also improve the radio frequency properties appropriately.

Furthermore, said antenna element is partly located between said second carrier and said first carrier. Both carriers sandwich the antenna element partly as the second carrier only covers the antenna element in the connecting area of the antenna unit. Both carriers can be attached to the antenna element by adhering, riveting, screwing, soldering, brazing, clamping and/or form fit. The means used may attach both carriers and the antenna element together simultaneously.

The invention further provides a radio frequency circuit comprising an antenna unit as mentioned above. For instance, this radio frequency circuit is a power sensor and/or part of a measurement system. Accordingly, the radio frequency circuit may also comprise at least one up-converter and/or one down-converter.

The invention also provides a method for manufacturing an antenna unit for receiving and/or emitting electromagnetic waves having a certain wavelength, said antenna unit comprising at least one antenna element made by a printed circuit board and a first carrier made by a dielectric material, said first carrier having a thickness being less than one fifth of said wavelength wherein said antenna element and said first carrier are attached to each other. As already mentioned, the first carrier does not negatively influence the electromagnetic performance of the antenna element, but it improves the mechanical stiffness even though a small sized antenna unit is provided. Generally, the first carrier and the antenna element are attached to each other in order to form the antenna unit having good radiation characteristics and good mechanical properties, in particular stiffness.

According to an aspect, said antenna element and said first carrier are attached to each other by adhering, riveting, screwing, soldering, brazing, clamping and/or form fit. Thus, the first carrier and the antenna element can be connected with each other easily.

In general, a mechanical or chemical connection is provided.

BRIEF DESCRIPTION OF DRAWINGS

The invention will now be described with reference to exemplary embodiments which are shown in the enclosed drawings. In the drawings, FIG. 1 schematically shows an antenna unit according to a first embodiment of the invention in a top view, FIG. 2 schematically shows a cross sectional view of the antenna unit shown in FIG. 1, FIG. 3 schematically shows an antenna unit according to a second embodiment of the invention in a top view, FIG. 4 schematically shows a cross sectional view of the antenna unit shown in FIG. 3, and FIG. 5 schematically shows a side view of an antenna unit according to a third embodiment, and FIG. 6 schematically shows another side view the antenna unit shown in FIG. 5.

DETAILED DESCRIPTION

Figure 1:
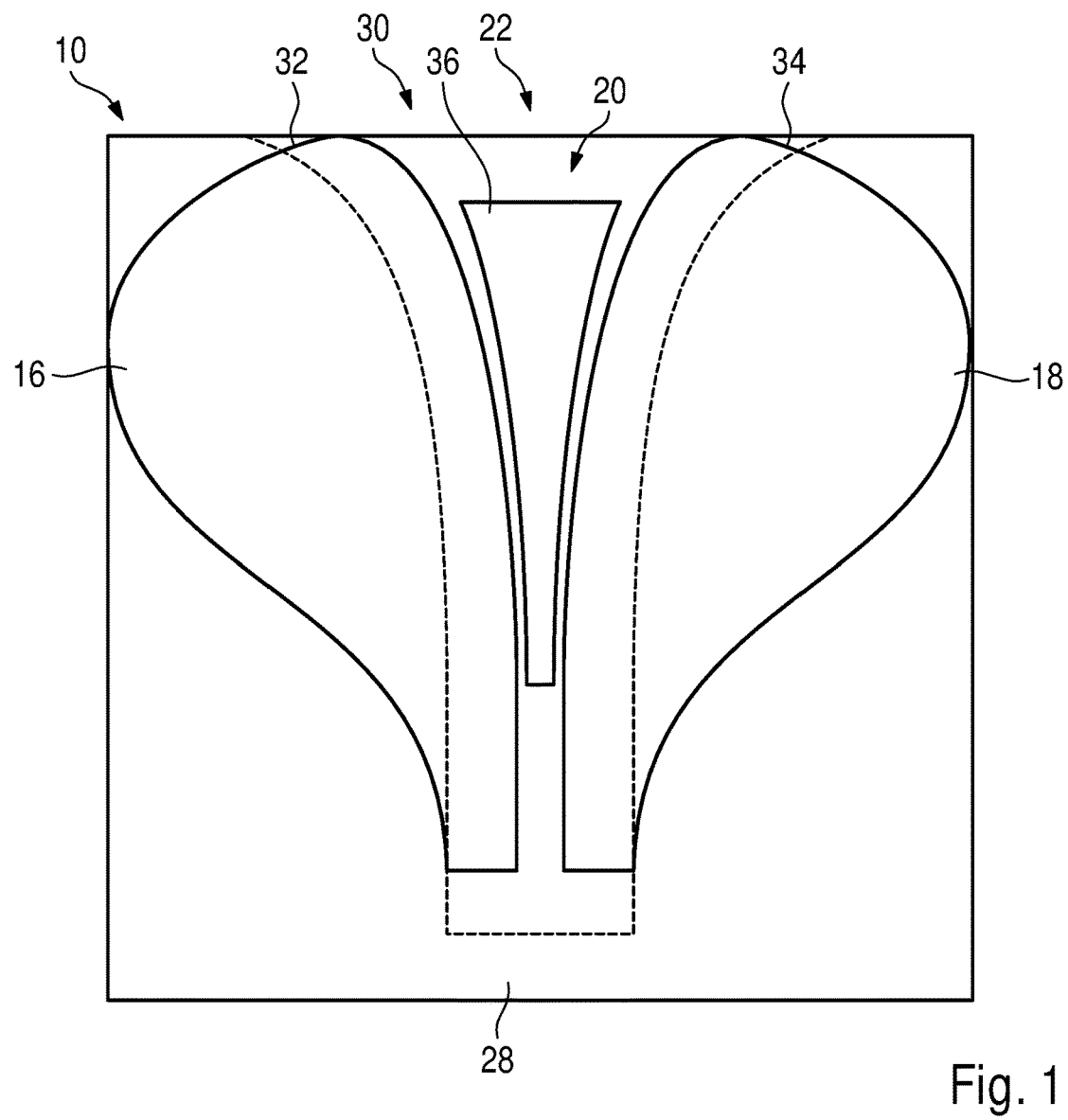
Figure 2:
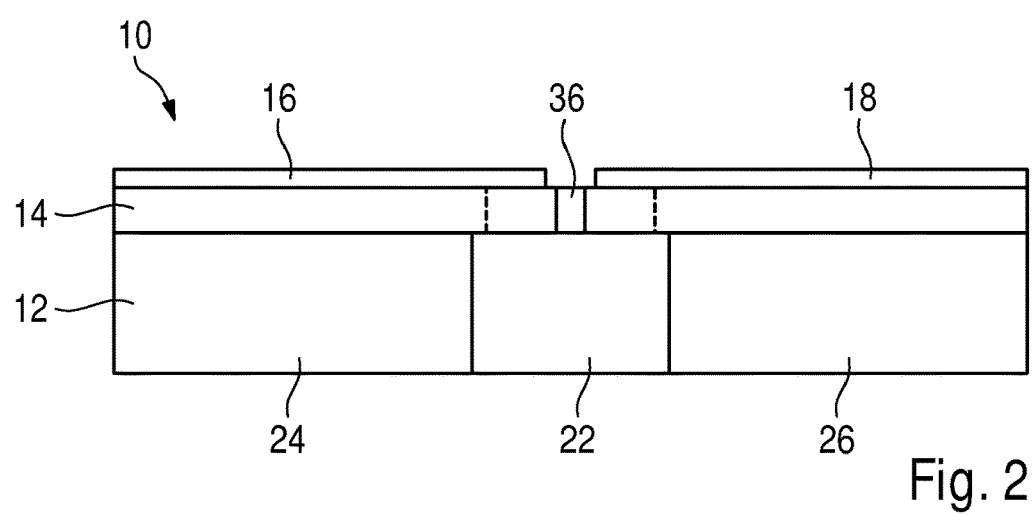

In FIGS. 1 and 2, an antenna unit 10 is shown which comprises a first carrier 12, an antenna element 14 and two conductive portions 16, 18.

The antenna unit 10 is a tapered slotline antenna unit as can be seen in FIG. 1, in particular regarding the shapes of the conductive portions 16, 18 being axial symmetrically arranged with respect to each other wherein the axis is provided by the main direction of the antenna unit 10.

Therefore, the antenna unit 10 comprises a slot region 20 which separates both conductive portions 16 and 18 as can be seen in FIG. 1. The slot formed within the slot region 20 widens to an end of the antenna unit 10.

Further, the first carrier 12 comprises at least one cutout 22 which is located in said slot region 20 (please refer to FIG. 1).

The first carrier 12 also comprises two first carrier portions 24, 26 which mainly correspond to both conductive portions 16, 18. Hence, the first carrier 12 supports the antenna element 14 at least in the regions where the antenna element 14 is covered by the conductive portions 16, 18.

Further, the first carrier 12 has a bridge portion 28 which interconnects the first carrier portions 24, 26 as can be seen in FIG. 1. In the shown embodiment, the bridge portion 28 is located at that end of the cutout 22 or the slot region 20 being narrower. Thus, the bridge portion 28 does not cover the cutout 22 in a perspective on the aperture 30 of the antenna unit 10 which is defined by the tapered portions 32, 34 of both conductive portions 16, 18. In other words, the cutout 22 is visible when looking on that end of the antenna unit 10 defining the aperture 30. The aperture 30 corresponds to the output of the antenna unit 10 which emits the electromagnetic waves. Further, the slot region 20 widens towards the aperture 30.

As can be seen in FIG. 1, the cutout 22 also widens towards the aperture 30. The edges of the first carrier 12 limiting the cutout 22 are substantially parallel to the edges of the conductive portions 16, 18 facing each other.

Moreover, the antenna element 14 has a wedge-like recess 36 which is located in the slot region 20 as can be seen in FIG. 1. This recess 36 also positively influences the radiation pattern of the antenna unit 10.

Generally, the shape of the first carrier 12 as well as the antenna element 14 ensures that the antenna unit 10 has good electromagnetic performance characteristics. Thus, the first carrier 12 is made of a material and shaped such that the first carrier 12 does not impair the performance characteristics of the antenna unit 10.

The first carrier 12 is made by a material having an electrical permittivity being less than the one of the antenna element 14. For instance the material of the first carrier 12 has a relative electrical permittivity being less than 10.

In the shown embodiment, the first carrier 12 is made by a printed circuit board panel wherein the antenna element 14 is also made by a printed circuit board panel. The first carrier 12 and the antenna element 14 are attached to each other in order to form the antenna unit 10, in particular adhered or glued together. Alternatively, the first carrier 12 is made by a dielectric material being formed like a plate.

Instead of an adhesive connection, the first carrier 12 and the antenna element 14 can be attached to each other by riveting, screwing, soldering, brazing, clamping and/or form fit. Generally, a mechanical or chemical attachment is provided.

As can be seen in FIG. 2, the antenna unit 10 is formed in a superposed manner since the first carrier 12, the antenna element 14 as well as the conductive portions 16, 18 are formed like layers being arranged in superposition. Thus, the antenna unit 10 is a multilayered device. In other words, the antenna unit is formed like a stack as shown in FIG. 2.

Generally, the first carrier 12 is used for improving the mechanical stiffness and robustness of the antenna unit 10. However, the first carrier 12 has a thickness being less when one fifth of the wavelength of the electromagnetic waves emitted by the antenna unit 10. This ensures a compact antenna unit 10 being less bulky even though it has a high mechanical stability.

Figure 3:
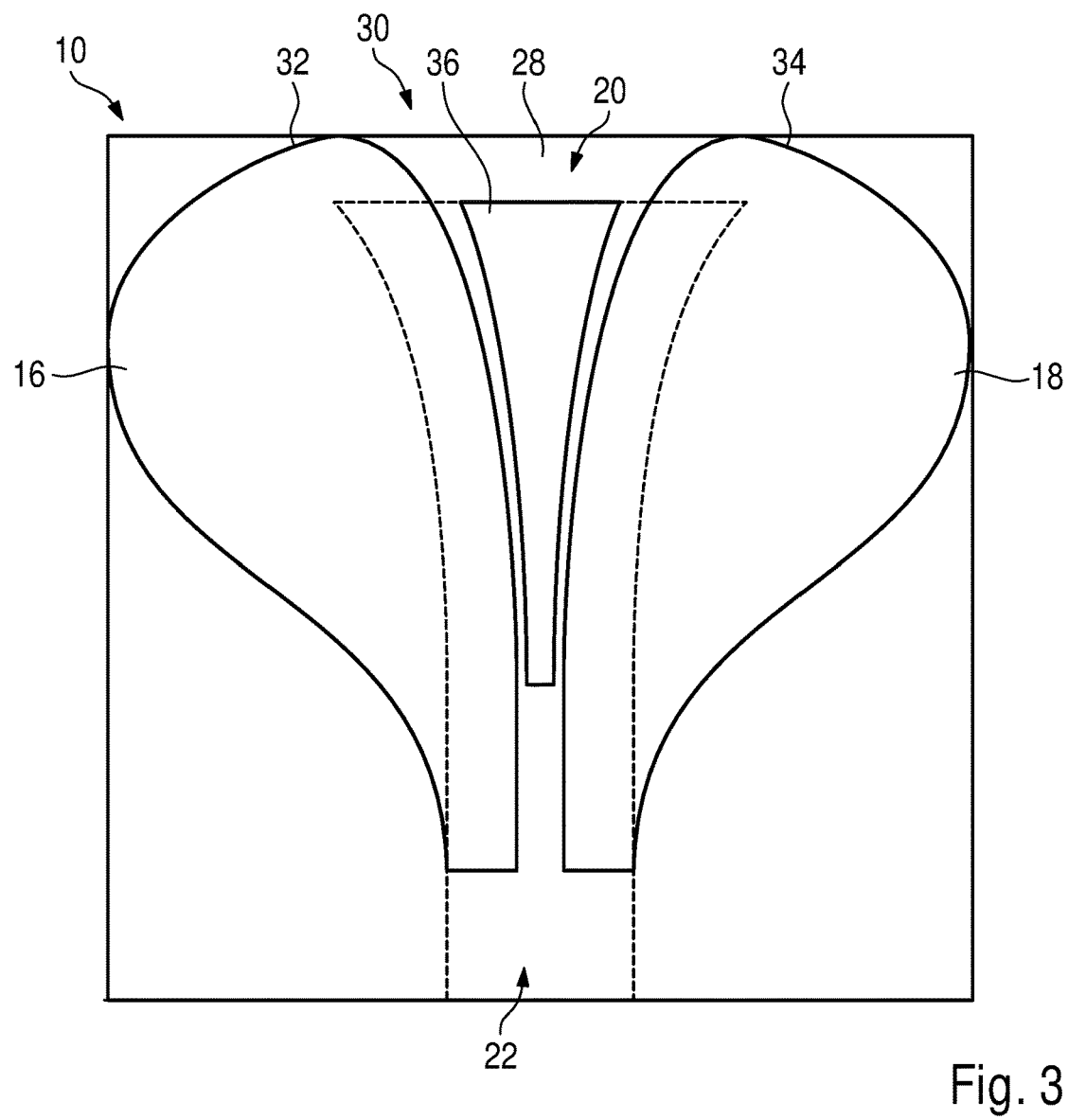
Figure 4:
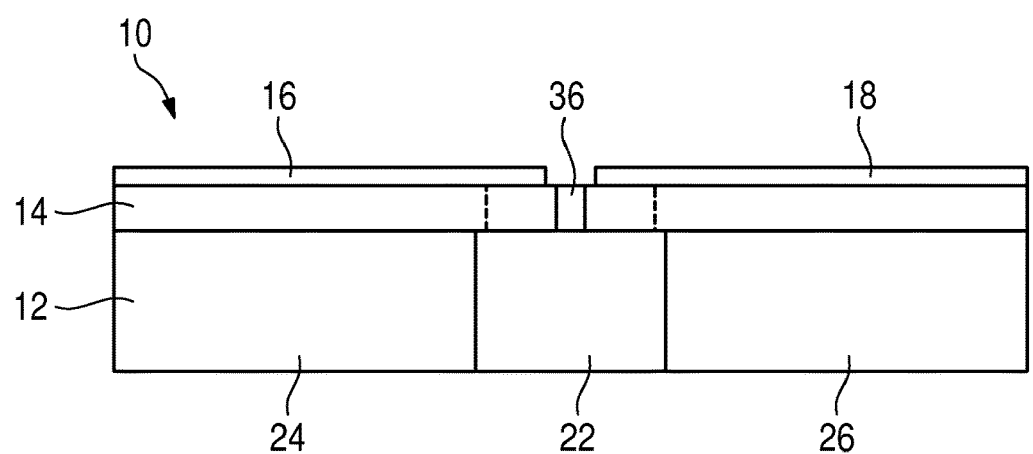

In FIGS. 3 and 4, a second embodiment of the antenna unit 10 is shown which differs to the one shown in FIGS. 1 and 2 in that the bridge portion 28 is located at that end of the slot region 20 being wider.

Thus, the bridge portion 28 is located next to the aperture 30 of the antenna unit 10. Accordingly, the bridge portion 28 covers the cutout 22 within the first carrier 12 when viewing on the aperture 30 of the antenna unit 10.

However, both embodiments show that the first carrier 12 has an open end formed by the cutout 22 and a closed opposite end formed by the bridge portion 28 with regard to the slot region 20.

Further, the cutout 22 is located in the slot region 20 of the antenna unit 10 since the power density is high in the slot region 20.

Generally, the bridge portion 28 is smaller in radiation direction of the antenna unit 10 than the wavelength of the electromagnetic waves emitted by the antenna unit 10. This ensures that the first carrier 12, in particular the bridge portion 28, does not impair the radio frequency characteristics of the antenna unit 10.

Figure 5:
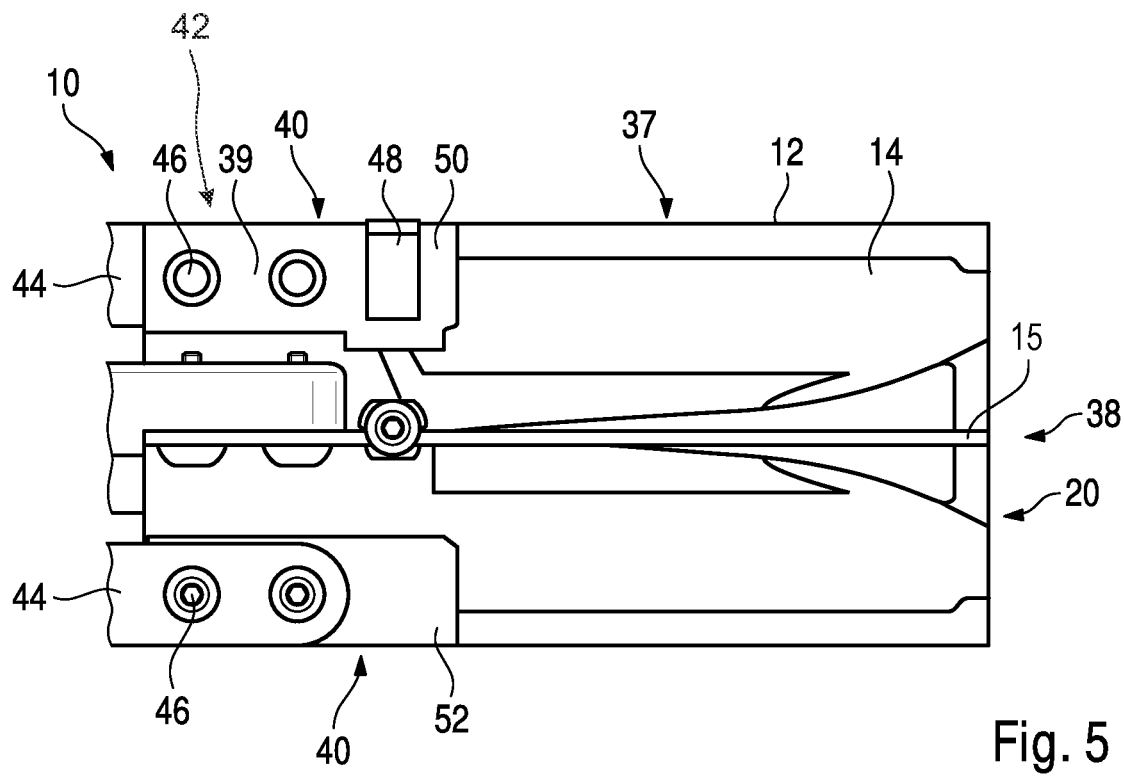

In FIG. 5, a third embodiment of the antenna unit 10 is shown in a side view wherein the conductive portions 16, 18 are not shown for better illustrative purposes.

In the shown embodiment, the antenna unit 10 comprises two antenna portions 37, 38 being arranged perpendicular to each other whereas the antenna units 10 shown in FIGS. 1 to 4 only have one antenna portion.

In the shown embodiment, both antenna portions 37, 38 are established differently. However, both antenna portions 37, 38 comprise antenna elements 14 and 15, respectively.

One of both antenna portions 37, labeled as the first antenna portion 37, is established by an antenna portion as described for the embodiments of the antenna unit 10 according to FIGS. 1 to 4. However, this first antenna portion 37 additionally comprises a second carrier 39 in comparison to the embodiments shown in FIGS. 1 to 4.

The respective antenna element 14 of the first antenna portion 37 may partly be sandwiched between the first carrier 12 and the second carrier 39 such that the antenna element 14 is contacted by the first and the second carrier 12, 39 on opposite sides. Then first carrier 12 and the second carrier 39 may also contact each other in their respective edge regions 40 as no material of the antenna element 14 is provided in these edge regions 40.

Alternatively, the second carrier 39 directly contacts the first carrier 12 over its entire surface.

In general, the second carrier 39 is located in a connection area 42 of the antenna unit 10, in particular the first antenna portion 37, that is provided at one end of the antenna unit 10, particularly the end being opposite to the slot region 20. As shown, both carriers 12, 39 and the first antenna element 14 disposed between both layers 12, 39 are attached to each other and a holder 44 by screws 46 that extend through appropriate openings in the carriers 12, 39 and the first antenna element 14.

Moreover, a terminal 48 for connecting the antenna unit 10 is shown that is also located in the connection area 42. Thus, the connection area 42 of the antenna unit 10 is configured to provide all connections required, namely a mechanical one via the holder 44 and screws 46 as well as an electrical one via the terminal 48.

The second carrier 39 inter alia increases the stiffness of the whole antenna unit 10, in particular in its connection area 42. The stiffness is increased as the second carrier 39 has a thickness being substantially twice as much as the one of the first carrier 12. In the shown embodiment, the thickness of the first carrier 12 is about 0.5 mm whereas the thickness of the second carrier 39 is about 1 mm.

As shown in FIG. 5, the second carrier 39 comprises two second carrier portions 50, 52 that are located at the edge regions 40 being opposite to each other. From these edge regions 40, both second carrier portions 50, 52 extend towards each other wherein they cover together approximately between 20% and 50% of the length of the first carrier 12 in that direction.

In another direction, namely the direction from the slot region 20 to the opposite end, the second carrier 39 extends over approximately 20% to 50% of the length of the first carrier 12 in that direction.

Both second carrier portions 50, 52 are shaped substantially symmetrically such that the overall design of the antenna unit 10, in particular the first antenna portion 37, is substantially symmetrically.

Figure 6:
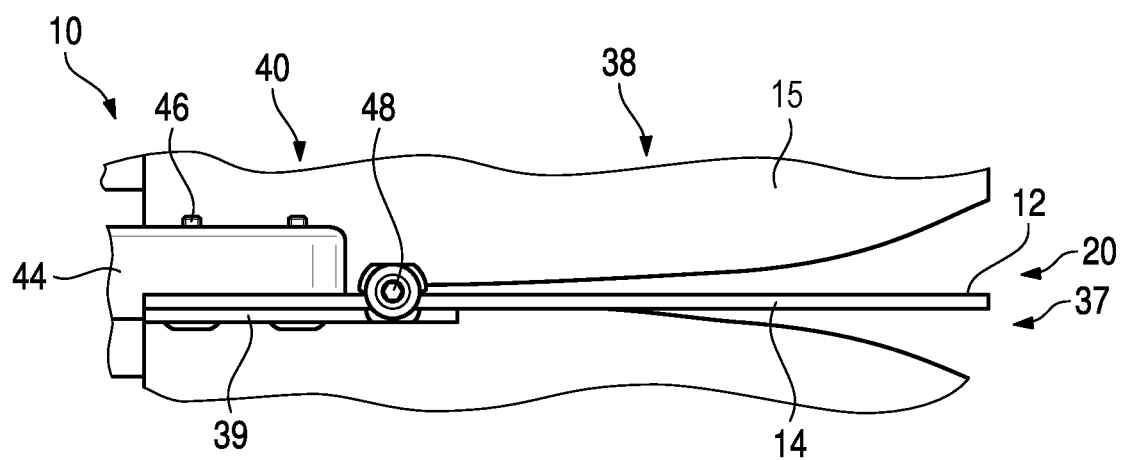

In the shown embodiment, the second antenna portion 38 being arranged perpendicular to the first antenna portion 37 is established by an antenna element 15 known in the prior art while having a thickness being substantially equal to the one of the first carrier 12 when comparing FIGS. 5 and 6.

However, the second antenna portion 38 may also be established by an antenna portion corresponding to the first antenna portion 37 which means that the antenna element is thin while being located between two carriers 12, 39 in order to increase the stiffness.

Particularly FIG. 6 reveals that the antenna element 14 of the first antenna portion 37 corresponding to the antenna units 10 shown in FIGS. 1 to 4 is very small in comparison to the thicknesses of the first carrier 12 and the second carrier 39.

As described for the embodiments shown in FIGS. 1 to 4, the first carrier 12 may have the cutout 22 in said slot region 20 or at the opposite end such that the appropriate bridge portion 28 is located at the other end, respectively.

Therefore, the antenna unit 10 according to the embodiment shown in FIGS. 5 and 6, in particular its first antenna portion 37, only differs from the first and second embodiments shown in FIGS. 1 to 4 in that the second carrier 39 is provided.

The second carrier 39 provides additional stiffness while not impairing the radio frequency properties of the antenna unit 10. In fact, the radio frequency properties are improved due to the selected thicknesses.

The antenna unit 10 is configured to be used with frequencies up to about 85 GHz.

In general, a broadband antenna unit 10 is provided which can be used in a frequency range between 400 MHz and 85 GHz. Accordingly, the thickness of the first carrier 12 is one fifth of the wavelength of the electromagnetic waves being the highest one which is processed by the antenna unit 10.

The antenna unit 10 is easy to manufacture since the first carrier 12 and the antenna element 14 are attached to each other in a mechanical or chemical manner. Further, the first carrier 12 and the second carrier are also attached to each other in a mechanical or chemical manner.

In general, a tapered slotline antenna unit 10 is provided which has small size and good radio frequency performance. Thus, the antenna unit 10 is suitable for integration with a radio frequency circuit and cross-polarized antennas.

Accordingly, a cheap and inexpensive antenna unit 10 is provided which can be used for measuring and analyzing purposes in a cost-efficient manner.

The invention claimed is:

1. An antenna unit for receiving and/or emitting electromagnetic waves having a certain wavelength, said antenna unit being a slotline antenna unit having a slot region, said antenna unit comprising an antenna portion including at least one antenna element and a first carrier, said first carrier being made by a dielectric material wherein said first carrier has at least one cutout in said slot region, said antenna element being made by a printed circuit board, said antenna element and said first carrier being attached to each other, wherein
    said first carrier has a thickness being less than one fifth of said wavelength,
    a second carrier is provided, said second carrier having a different shape with regard to said first carrier, and
    the second carrier comprises two separate spaced apart second carrier portions located on opposite edge regions on a same side of the first carrier, wherein a holder is provided, and wherein said first carrier and said second carrier are attached to each other and to said holder.

2. The antenna unit according to claim 1, wherein said first carrier has at least two first carrier portions being partially separated by said cutout.

3. The antenna unit according to claim 2, wherein said first carrier has at least one bridge portion.

4. The antenna unit according to claim 3, wherein said bridge portion interconnects both first carrier portions.

5. The antenna unit according to claim 3, wherein said bridge portion is located at a first end of said slot region that is wider than a second opposite end of the slot region.

6. The antenna unit according to claim 3, wherein said bridge portion is located at an end of said slot region that is narrower than an opposite end of the slot region.

7. The antenna unit according to claim 3, wherein said bridge portion is smaller in radiation direction than said wavelength.

8. The antenna unit according to claim 1, wherein said first carrier is formed by a material having a relative electrical permittivity being less than 10.

9. The antenna unit according to claim 1, wherein said antenna element and said first carrier both are formed by a printed circuit board panel.

10. The antenna unit according to claim 1, wherein said first carrier is configured such that it provides mechanical stiffness without impairing the radio frequency characteristics of said antenna unit.

11. The antenna unit according to claim 1, wherein said first carrier and said antenna element are chemically or mechanically attached to each other.

12. The antenna unit according to claim 1, wherein said first carrier and said antenna element are attached to each other by adhering, riveting, screwing, soldering, brazing, clamping and/or form fit.

13. The antenna unit according to claim 1, wherein said second carrier is located in a connecting area of said antenna unit.

14. The antenna unit according to claim 1, wherein said second carrier has a thickness being substantially twice the thickness of said first carrier.

15. The antenna unit according to claim 1, wherein said antenna element is partly located between said second carrier and said first carrier.

16. A radio frequency circuit comprising the antenna unit according to claim 1.

17. A method for manufacturing an antenna unit for receiving and/or emitting electromagnetic waves having a certain wavelength, said antenna unit being a slotline antenna unit having a slot region, said antenna unit comprising at least one antenna element made by a printed circuit board and a first carrier made by a dielectric element, said first carrier having a thickness being less than one fifth of said wavelength wherein said antenna element and said first carrier are attached to each other, wherein said first carrier is provided with at least one cutout in said slot region, wherein said first carrier includes at least one bridge portion, and the bridge portion of the first carrier is located at a first end of said slot region that is wider than a second opposite end of the slot region, wherein a holder is provided, and wherein said first carrier and said second carrier are attached to each other and to said holder.

18. The method according to claim 17, wherein said antenna element and said first carrier are attached to each other by adhering, riveting, screwing, soldering, brazing, clamping and/or form fit.

\* \* \* \* \*